United States Patent [19]

Vale

[11] 4,048,595
[45] Sept. 13, 1977

[54] INFORMATION EXTRACTION FOR DOPPLER RADAR

[75] Inventor: Christopher R. Vale, Elkridge, Md.

[73] Assignee: Westinghouse Electric Corporation, Pittsbugh, Pa.

[21] Appl. No.: 651,305

[22] Filed: Jan. 22, 1976

[51] Int. Cl.² .......................... H03H 9/32; H03H 7/48
[52] U.S. Cl. ...................................... 333/72; 310/318; 333/6
[58] Field of Search ................... 333/72, 71, 76, 70 R, 333/6, 1; 331/76, 77; 310/8, 8.1, 8.2

[56] References Cited

U.S. PATENT DOCUMENTS

| | | | |
|---|---|---|---|
| 2,459,019 | 1/1949 | D'Heedene | 333/72 |
| 3,426,300 | 2/1969 | Ho | 333/72 |
| 3,613,031 | 10/1971 | Pond | 333/72 |

*Primary Examiner*—Alfred E. Smith
*Assistant Examiner*—Marvin Nussbaum
*Attorney, Agent, or Firm*—R. M. Trepp

[57] ABSTRACT

A filter array is provided for extracting velocity information from the return pulse of a Doppler radar system. The array consists of a plurality of two-pole, bandpass crystal filter networks directly connected in parallel, the filter networks including crystal resonators and all but one of the networks having reactances in series with the resonators. The crystal resonators are identical in all of the networks and the reactances change progressively in successive networks in such a manner that adjacent filter networks respond to contiguous frequency bands.

6 Claims, 4 Drawing Figures

INFORMATION EXTRACTION FOR DOPPLER RADAR

BACKGROUND OF THE INVENTION

The present invention relates to information extraction for Doppler radar systems, and more particularly to a filter array for such systems.

In Doppler radar systems, the return pulse reflected back from a moving target contains information indicating the presence of the target and the radial velocity of the target relative to the transmitter. Extraction of the first type of information, that is, the presence of a target, is relatively simple and this is often the only type of information desired. When information as to the velocity of the target is also required, however, complex and expensive schemes have heretofore been necessary.

The velocity information contained in a return radar pulse reflected from a moving target involves a change in frequency of the return pulse which is related to the frequency of the transmitted pulses and to the radial velocity of the target. The frequency, or frequency change, of the return pulse must, therefore, be detected to extract the desired information, and this has been done by means of banks of filters responsive to contiguous frequency bands. The return signal is applied to the filter bank and the frequency is determined by identifying the filter which passes the signal. The desired velocity of the target can then be calculated from this information. The velocity information extraction systems used heretofore, therefore, have involved the use of banks of contiguous filters with isolation networks between them, or crystal sharing filter banks which require active networks or digital processing techniques. Such systems are very complex and are difficult and expensive to produce, and are also wasteful of either signal energy or primary energy.

SUMMARY OF THE INVENTION

The present invention provides a filter array which utilizes only simple filter networks and avoids the complication and expense of prior systems.

In accordance with the invention, an array of simple, inexpensive filter networks is utilized. Each of these networks comprises a two-pole, bandpass crystal filter, and all except one of the networks also includes reactances. Such networks can be directly connected in parallel, so that no isolating networks are required, and the crystal resonators in all the filter networks may be identical for low cost. The network which has no reactance determines an intermediate frequency, and the reactances of adjacent networks have progressively different values on opposite sides of this intermediate network to establish contiguous bandpass frequencies, the reactances being inductive on one side of the intermediate network and capacitive on the other side. In this way, a very simple system is provided utilizing low-cost, readily available components and without the complication or expense of the filter banks which have previously been used.

BRIEF DESCRIPTION OF THE DRAWING

The invention will be more fully understood from the following detailed description, taken in connection with the accompanying drawing, in which.

DESCRIPTION OF THE PREFERRED EMBODIMENT

As previously discussed, the velocity information contained in a return radar pulse is represented by the change in frequency of the return pulse. The frequency of the return pulse can be detected by means of filters and this has led to the use of filter banks, as mentioned above, to enable the frequency to be detected by identifying the particular filter of a contiguous bank which passes the received signal.

In accordance with the invention, a much simpler and less expensive filter array is provided than the complicated and expensive filter banks previously used, and which also makes possible improved performance. These results are obtained by the use of simple crystal filters. The simplest crystal filter is a two-pole, bandpass, ladder-type filter which contains no tuning elements or coils and consists simply of two crystal resonators coupled by a capacitor. Studies of such filters show that the out-of-band input impedance is reactive and substantially higher than the in-band input impedance, the sign of the reactance depending on whether the impedance is examined above or below the bandpass range of the filter. As a result of this effect, these simple crystal networks can have closely contiguous bandwidths, and can have all of their inputs directly connected in parallel with no serious distortion of the response of the individual members of an array. Since reactance in series with a crystal resonator causes the series resonance frequency to shift, an array of contiguous filter networks can be provided by connecting reactors of proper value to each of the crystal resonators to provide a series of filter networks having contiguous bandwidths. Such networks can be directly connected in parallel and a very simple and inexpensive filter array is thus obtained.

Figure 1:
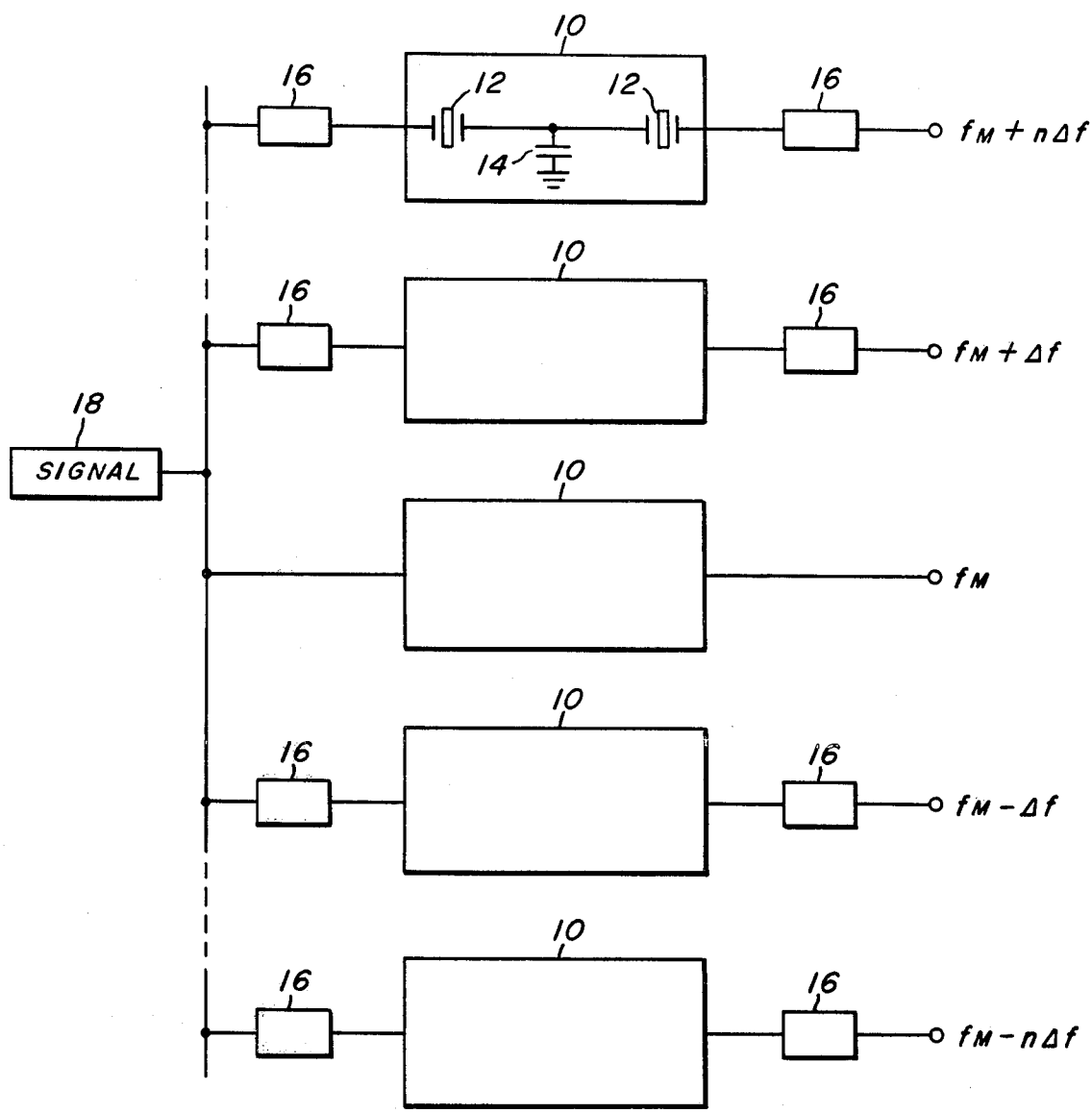
FIG. 1 is a schematic diagram illustrating the invention.
Figure 2:
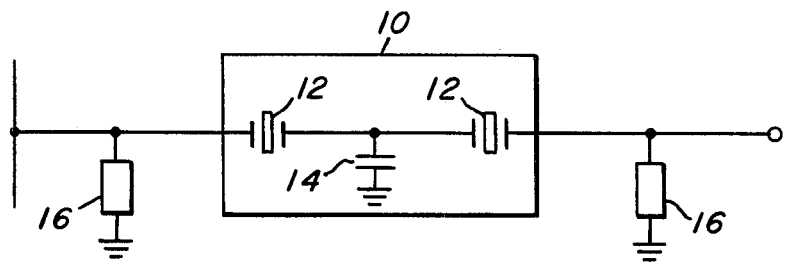
FIG. 2 is a diagram of a filter network showing an alternative arrangement.

A filter array embodying the invention is shown schematically in FIG. 1. As there shown, each filter network includes a crystal filter 10 of the two-pole ladder type consisting of two crystal resonators 12 coupled by a capacitor 14. All of the crystal resonators 12 are identical and are selected to provide a desired intermediate bandwidth frequency. One of the filter networks, therefore, consists only of the crystal filter 10 with the intermediate frequency $f_M$. Each of the other filter networks has reactances 16 of suitable value connected in series therewith, the reactances preferably being divided and connected on opposite sides of the resonator 10. If desired, the reactances 16 could be connected in parallel with the load and source impedances, as shown in FIG. 2, using the known series to parallel narrow-band transformation.

The values of the reactances 16 are chosen to change the frequency bands of the respective filter networks in the manner indicated in FIG. 1 such that each filter network is contiguous to the adjacent networks and the center frequencies change by an amount $\Delta f$ which may be made as small as one 3 db bandwidth, for example. The signs of the reactances 16 are opposite on opposite sides of the intermediate frequency network so that the frequency bands of the successive networks change in opposite directions from the intermediate frequency, and the reactances of successive networks change progressively to obtain the desired number and spacing of bandwidths. Any desired number of filter networks, within practical limits, can thus be connected in parallel to a signal source 18 to identify the frequency of the signal.

The use of identical crystal resonators 12 in all the filter networks of the array is important because it greatly reduces the cost of the system. The intermediate frequency $f_M$ can often be chosen at a relatively arbitrary point, which involves the possibility of choosing a frequency which can be obtained by the use of commercially available, low-cost material. For example, color television crystals are produced at 3.58 megahertz for American use and at 4.43 megahertz for European use. Such crystals are ideal since the frequency is suitable and they are produced in large quantities and of sufficiently high quality, while the cost is quite low because of the quantity production. Lower frequency crystals ($2^{13}$ Hz to $2^{20}$ Hz) for use in the watch and clock industry are also available at low cost. Any available crystal resonator of sufficient accuracy may thus be used if the frequency obtainable is suitable for the particular purpose. Crystal filter arrays can readily be designed in this way to meet the requirements of most radar and sonar applications. Using standard, readily available crystals such as those mentioned above, the filter networks can readily be made to have bandwidths ranging between 0.01% and 0.10% of the intermediate frequency $f_M$, while the extent of the filter array can readily extend over a range of ±0.2% of $f_M$ with spacing between adjacent networks as close as one 3 db bandwidth.

Figure 3:
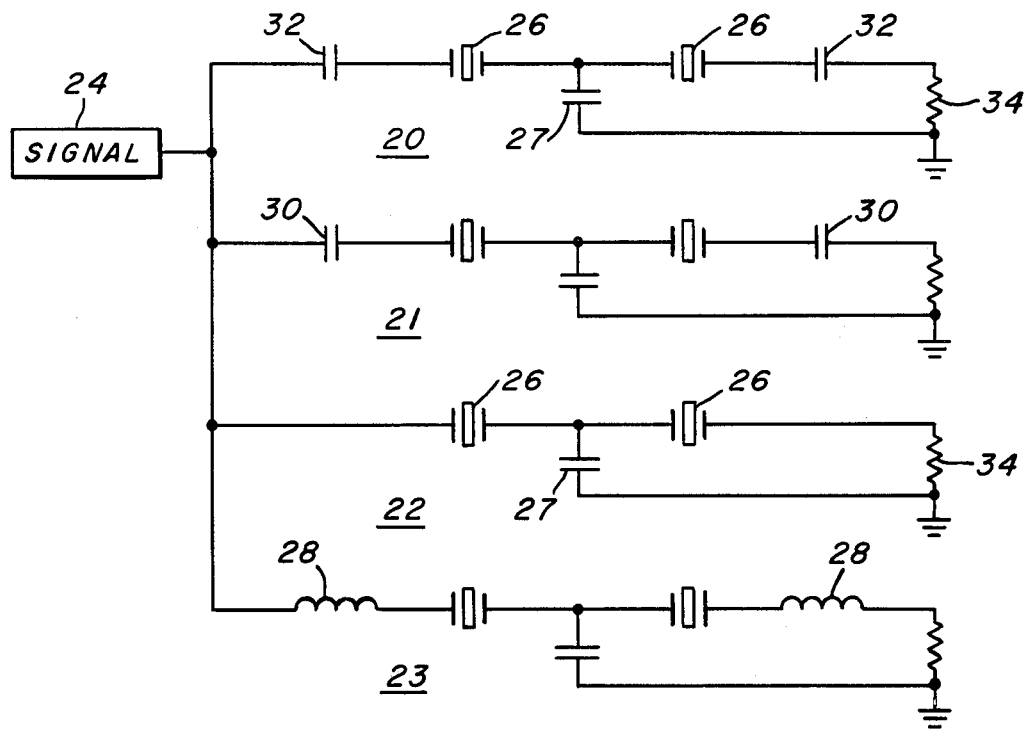
FIG. 3 is a diagram of a filter array embodying the invention.

An illustrative embodiment of the invention is shown in FIG. 3. A filter array is there shown consisting of four individual filter networks 20, 21, 22 and 23 with their inputs directly connected together in parallel to a signal source 24. Each of the networks includes a crystal filter, similar to that previously described, consisting of two crystal resonators 26 coupled by a capacitor 27. As previously discussed, the crystal resonators are identical in all four of the networks. The network 22 is the intermediate frequency network and consists only of a simple crystal filter. In this illustrative embodiment of the invention, the crystals 26 are 3.58 megahertz crystals which as mentioned above are used for color television and crystals of high quality are readily available at low cost. The filter network 23 on one side of the intermediate frequency network 22 has inductive reactance connected in series with the crystals and, as shown, this is divided into two coils 28 which may each have a value of 22 microhenries. On the other side of the intermediate frequency network 22, the networks 20 and 21 have capacitive reactance in series to provide the desired frequency responses. For example, the network 21 may have capacitors 30 connected on each side of the crystal filter, each of the capacitors 30 having a value of 75 picofarads, while the network 20 may have a capacitor 32 on each side of the crystal filter, each having a value of 36 picofarads. The output signals of all four of the filter networks appear across identical output resistors 34 which may be standard 110 ohm resistors.

Figure 4:
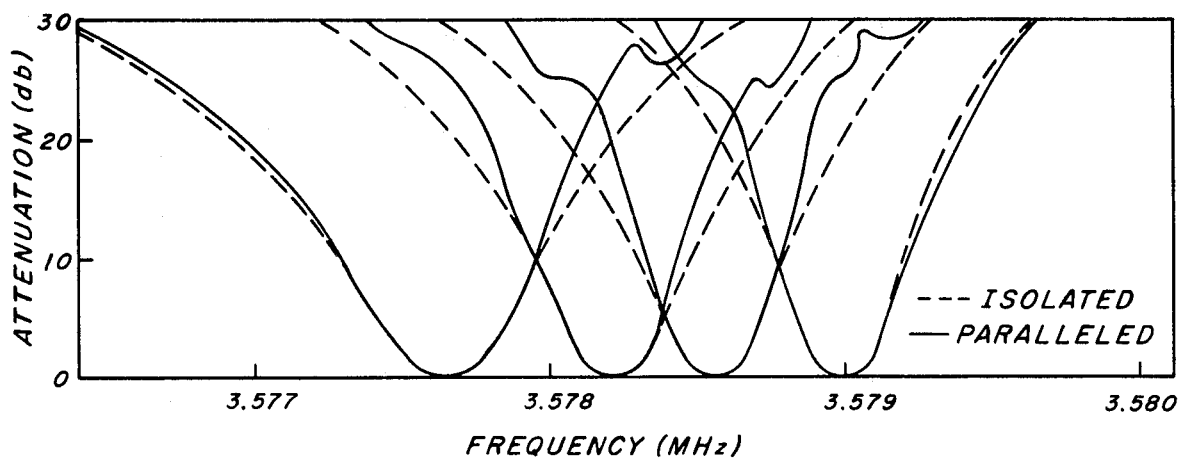
FIG. 4 is a set of curves showing the frequency response of the network of FIG. 3.

The frequency response characteristics of this illustrative filter array are shown in FIG. 4, the characteristic of each filter network being shown both isolated and after paralleling with the other networks. It will be seen that the bandwidths of the four filter networks are contiguous and relatively closely spaced, and it will also be observed that the selectivity of each filter network is improved by connecting the network in parallel, since they each have a flatter passband after paralleling with more rejection in the adjacent passband than a simple isolated filter. Thus, the identification of the precise frequency of the radar return pulse is easier because there is less ambiguity. The spacing between contiguous bandpass frequencies can be made closer than that shown in FIG. 4 if desired, as the characteristic curves of adjacent filters can be made to cross at even lower attenuation.

It will now be apparent that a filter array has been provided for information extraction in Doppler radar systems which has many advantages. The new filter array is much simpler and less expensive than the contiguous filter banks used heretofore since it utilizes only simple crystal filters with all crystals in the array being identical, so that low-cost crystals can be used, together with inexpensive fixed coils and capacitors for the necessary series reactance. A very simple and inexpensive system is thus provided since all the components are conventional devices which are readily available at low cost. No isolation resistors or networks are necessary and no power drain is involved since the filter elements are entirely passive devices. The performance of the filter array, however, is improved as can be seen from FIG. 4 since the response of the individual filter networks is improved by paralleling as discussed above, and the reliability is high since no tunable elements are required and only simple rugged devices are utilized.

What is claimed is:

1. A crystal filter array comprising a plurality of individual two-pole bandpass filter networks directly connected together for connection in parallel to a single signal source, each of said filter networks including two crystal resonators connected in series and a capacitor connecting the junction between the resonators to ground, all of the crystals in all of the networks being identical, and reactance means connected in the circuit of at least some of said networks in a manner to modify the frequency response of the network, said reactance means being different in each network.

2. A filter array as defined in claim 1 in which adjacent filter networks respond to contiguous frequency bands.

3. A filter array as defined in claim 1 in which said reactance means are connected in series with the crystal resonators.

4. A filter array as defined in claim 1 in which said reactance means are connected in parallel with the crystal resonators.

5. A filter array as defined in claim 1 in which one of said filter networks has no reactance means and the remaining filter networks have reactance means which change progressively in reactance from each network to the next adjacent network.

6. A filter array as defined in claim 5 in which said one network is in an intermediate position in said array of networks and the reactance means of the filter networks on one side of said one network are inductive and the reactance means of the filter networks on the other side are capacitive.

* * * * *